(12) United States Patent  
Song

(10) Patent No.: US 7,903,831 B2  
(45) Date of Patent: Mar. 8, 2011

(54) SILICON BASED CONDENSER MICROPHONE AND PACKAGING METHOD FOR THE SAME

(75) Inventor: Chung Dam Song, Seoul (KR)

(73) Assignee: BSE Co., Ltd., Namdong-gu, Incheon (KR)

( * ) Notice: Subject to any disclaimer, the term of this patent is extended or adjusted under 35 U.S.C. 154(b) by 1237 days.

(21) Appl. No.: 11/506,664

(22) Filed: Aug. 18, 2006

(65) Prior Publication Data

US 2007/0041597 A1     Feb. 22, 2007

(30) Foreign Application Priority Data

Aug. 20, 2005 (KR) .................. 10-2005-0076521
Aug. 20, 2005 (KR) .................. 10-2005-0076522

(51) Int. Cl.
*H04R 25/00* (2006.01)

(52) U.S. Cl. .......................... 381/174; 381/175
(58) Field of Classification Search ............. 381/170, 381/174, 175, 190, 191
See application file for complete search history.

(56) References Cited

U.S. PATENT DOCUMENTS

| 6,781,231 | B2 | 8/2004 | Minervini |
| 7,202,552 | B2 * | 4/2007 | Zhe et al. ............... 257/659 |
| 2005/0123155 | A1 * | 6/2005 | Song et al. .............. 381/174 |

* cited by examiner

*Primary Examiner* — Tuan D Nguyen
(74) *Attorney, Agent, or Firm* — Ladas & Parry LLP

(57) ABSTRACT

Disclosed are a silicon based condenser microphone and a packaging method for the silicon based condenser microphone. The silicon based condenser microphone comprises a metal case, and a board which is mounted with a MEMS microphone chip and an ASIC chip having an electric voltage pump and a buffer IC and is formed with a connecting pattern for bonding with the metal case, wherein the connecting pattern is welded to the metal case. The method for packaging a silicon based condenser microphone includes the steps of inputting a board which is mounted with a MEMS chip and an ASIC chip and is formed with a connecting pattern; inputting a metal case, aligning the metal case on the connecting pattern of the board, and welding an opened end of the metal case to the connecting pattern of the board. Thus, the metal case is welded to the board by the laser.

28 Claims, 14 Drawing Sheets

SILICON BASED CONDENSER MICROPHONE AND PACKAGING METHOD FOR THE SAME

TECHNICAL FIELD

The present invention relates to a condenser microphone, and, more particularly, to a silicon based condenser microphone which packages a silicon microphone chip fabricated by a MEMS technology to increase a mechanical firmness and enhance effects for preventing noise from entering the microphone and a packaging method for the silicon based condenser microphone.

BACKGROUND ART

Generally, a condenser microphone which has been widely used in mobile equipment or audio equipment consists of a voltage bias element, a pair of a diaphragm and a back plate for forming a capacitor which is changed corresponding to sound pressure, and a JFET for buffering an output signal. This typical condenser microphone has an assembly which is integrally assembled by inserting a diaphragm, a spacer ring, an insulating ring, a back plate, a conductive ring and a PCB into a case.

Recently, a semiconductor fabricating technology using a micromachining technology has been introduced for an integrated micro device. According to this technology which is called MEMS (Micro Electro Mechanical System), a sensor, an actuator and an electro mechanical structure can be fabricated in a μm unit using a micromachining technology which applies a semiconductor fabricating process, especially, an integrated circuit technology. A MEMS chip microphone manufactured by the micromachining technology has merits that include miniaturization, high-performance, multifunction and integration, which can be obtained through the high precision micromachining technology, and safety and reliability can be enhanced.

However, since the MEMS chip microphone manufactured by the micromachining technology should perform electrical driving and signal processing, it is required to package the microphone with another special purpose semiconductor chip device, that is, an ASIC (Application Specific Integrated Circuit).

A conventional technology for packaging a MEMS chip microphone is disclosed in U.S. Pat. No. 6,781,231 issued Aug. 25, 2004 and entitled by "Micro Electro Mechanical System Package with Environmental and Interference Shield". The above package has a structure for adhering a cover which consists of an internal conductive layer and an external conductive layer on a multi-layered substrate which is alternately overlapped by a conductive layer and a non conductive layer using a conductive adhesive.

Thus, the conventional packaging method has problems in that a manufacturing cost is raised and a bonding property is deteriorated due to a complex process, and the method is sensitive to external noise such as an electromagnetic wave noise and the like since a non conductive material unlike a metal housing is used.

SUMMARY

Accordingly, in order to solve the problems, the present invention provides a silicon based condenser microphone for increasing bonding strength and having high resistance to external noise such as electromagnetic waves by welding an opened end of a metal case to a substrate which is mounted with MEMS microphone parts and a packaging method for the silicon based condenser microphone.

According to an aspect of the present invention, there is provided a silicon based condenser microphone comprising: a metal case; and a board which is mounted with a MEMS microphone chip and an ASIC chip having a electric voltage pump and a buffer IC and is formed with a connecting pattern for bonding with the metal case, the connecting pattern being welded to the metal case.

Further, according to another aspect of the present invention, there is provided a method for packaging a silicon based condenser microphone, the method comprising the steps of: inputting a board which is mounted with a MEMS chip and an ASIC chip and is formed with a connecting pattern; inputting a metal case; aligning the metal case on the connecting pattern of the board; and welding an opened end of the metal case to the connecting pattern of the board.

Here, the metal case may have any one of a cylindrical shape and a rectangular parallelepiped shape. Further, an opened end of the metal case may have any one of a straight line shape and a skirt shape which is formed by bending the opened end outwardly.

Further, the board may be any one selected from the group of a PCB, a ceramic board, a FPCB and a metal PCB. The metal case may be made of any one selected from the group of brass, aluminum and nickel alloy. Further, the welding may be any one selected from the group of laser welding, electric welding, soldering, and bonding using a conductive adhesive. Further, the board may be formed with two to eight connecting terminals for connecting with an external device. The board may be formed with a rear sound inlet hole for collecting a rear sound, whereby the microphone has directivity.

BRIEF DESCRIPTION OF THE DRAWINGS

The above and other objects and features of the invention will become apparent from the following description of preferred embodiments taken in conjunction with the accompanying drawings, in which.

DESCRIPTION OF THE PREFERRED EMBODIMENTS

Hereinafter, preferred embodiments of the present invention will be explained in detail with reference to the appended drawings.

A first embodiment is an example wherein a case is formed with a sound hole for collecting sound and a number of modifications of the first embodiment will be shown in order. A second embodiment is an example wherein a microphone board is formed with a sound hole for collecting sound and a number of modifications of the second embodiment will be shown in order. A third embodiment is an example wherein a microphone board is formed with a sound hole and an inserting hole is formed with a main PCB and a number of modifications of the first embodiment will be shown in order.

Embodiment 1

Modification 1 of Embodiment 1

Figure 1:
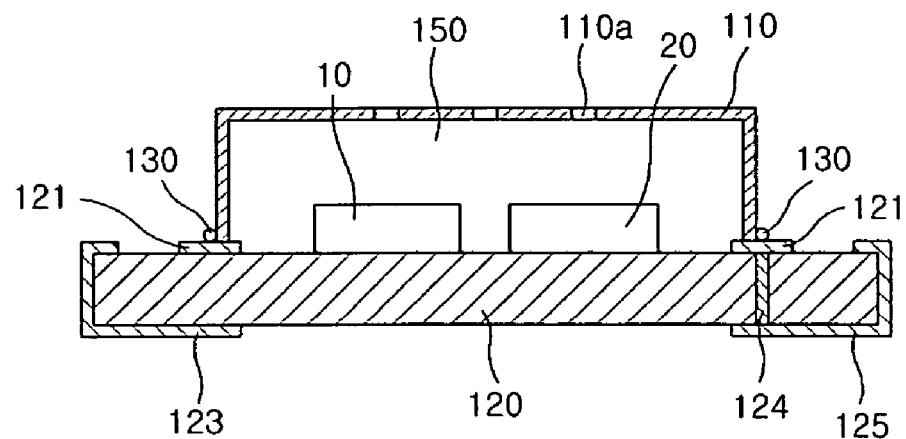
FIG. 1 is a sectional side view of a first modification of a first embodiment according to the present invention.
Figure 2:
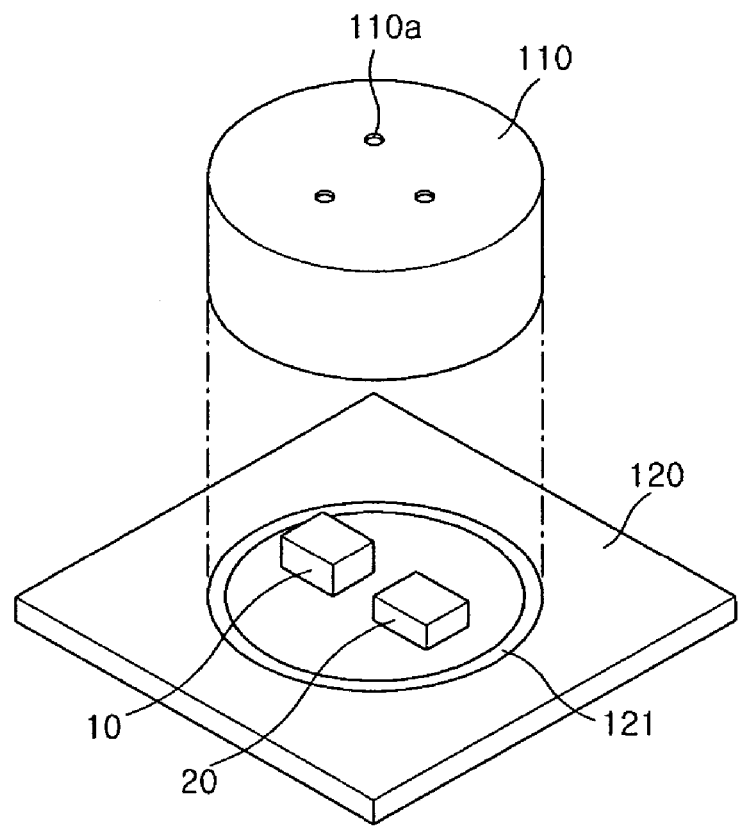
FIG. 2 is an exploded perspective view of a first modification of a first embodiment according to the present invention.
Figure 3:
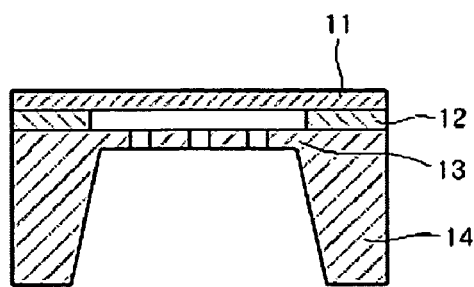
FIG. 3 is a view showing an example of a structure for a MEMS chip of a silicon based condenser microphone applied to each embodiment of the present invention in common.
Figure 4:
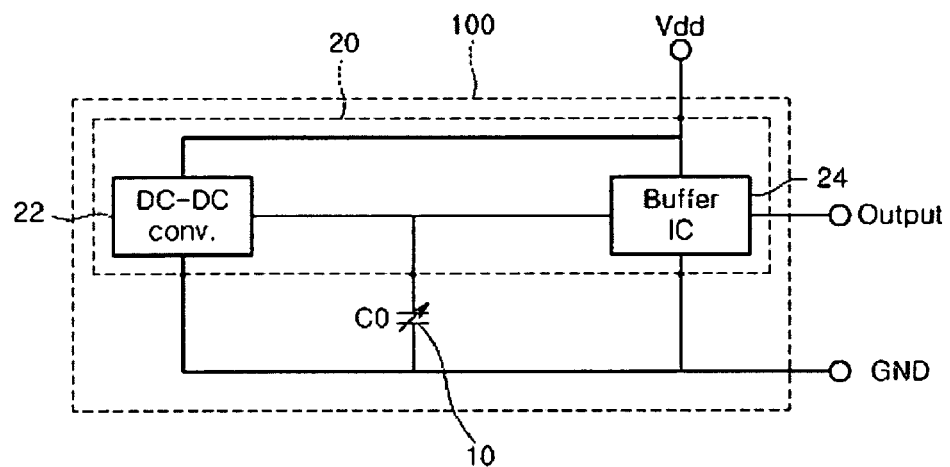
FIG. 4 is a circuit diagram of a silicon based condenser microphone applied to each embodiment of the present invention in common.

FIG. 1 is a sectional side view of a first modification of a first embodiment according to the present invention, FIG. 2 is an exploded perspective view of a first modification of a first embodiment according to the present invention, FIG. 3 is a view showing an example of a structure for a MEMS chip of a silicon based condenser microphone applied to each embodiment of the present invention in common, and FIG. 4 is a circuit diagram of a silicon based condenser microphone according to the present invention.

According to a first modification of a first embodiment, as shown in FIGS. 1 and 2, a cylindrical metal case 110 is welded to a PCB 120 which is mounted with a MEMS chip 10 and an ASIC chip 20 by a laser.

Referring to FIGS. 1 and 2, the PCB 120 is mounted with the MEMS chip 10 and the ASIC chip 20 and is formed with a circular connecting pattern 121 on a portion which contacts the metal case 110. Meanwhile, if necessary, the PCB 120 may be mounted with a capacity or a resistor, which is not shown in the drawings, for shielding electromagnetic waves or ESD. Since the PCB 120 is broader than the metal case 110, connecting pads or connecting terminals for connecting with an external device can be freely disposed on the broad PCB. The connecting pattern 121 is formed by forming a copper cladding through a PCB manufacturing process and then plating Ni or Au. Here, the board 120 may be a printed circuit board (PCB), a ceramic board, a flexible PCB (FPCB) or a metal PCB.

The metal case 110 has a cylindrical shape having an opening which faces the PCB 120 to receive the chip parts therein, wherein an upper surface thereof is formed with a sound hole 110a for collecting sound. The metal case 110 is made of any one selected from the group of brass, copper, stainless steel, aluminum, nickel alloy and the like. Further, the metal case 110 is plated with Au or Ag. The metal case 110 may have various shapes such as a circle, a square and the like.

After aligning the metal case 110 on the connecting pattern 121 of the PCB 120, a connecting portion 130 thereof is welded by a laser (not shown), thereby finishing a microphone package. Here, the connecting pattern 121 is connected with a ground terminal 125, wherein, if the metal case 110 is welded to the connecting pattern 121, there is a merit in that it is easy to eliminate noise by interrupting the inflow of external noise.

As such, according to the packaged microphone assembly, as shown in FIG. 1, the metal case 110 is firmly adhered to the connecting pattern 121 of the PCB 120 by the laser welding, wherein a space 150 between the metal case 110 and the PCB 120 serves as a sound chamber.

Further, the PCB 120 may be formed with connecting terminals 123 and 125 for connecting with the external device on a bottom surface thereof, wherein the number of the connecting terminals 123 and 125 is two to eight. Each of the connecting terminals 123 and 125 is electrically connected through through-hole 124 to a chip part surface. Specially, according to the embodiment of the present invention, if extending the connecting terminals 123 and 125 to a circumference of the PCB 120, an electric soldering iron can be applied to an exposed surface, whereby a rework operation can be easily performed.

The MEMS chip 10, as shown in FIG. 3, has a structure that a back plate 13 is formed on a silicon wafer 14 by using a MEMS technology and then the back plate faces a vibration membrane 11 with a spacer 12 interposed between the back plate 13 and the vibration membrane 11. Since the MEMS chip 10 is applied to each embodiment of the present invention in common and this fabricating technology of the MEMS chip 10 has been provided, further explanation of this aspect will be omitted.

The ASIC chip 20 which is connected with the MEMS chip 10 to process electrical signals, as shown in FIG. 4, includes an electric voltage pump 22 for supplying an electric pressure to allow the MEMS chip 10 to operate as a condenser microphone, and a buffer IC 24 for amplifying an electric sound signal sensed through the MEMS chip 10 or performing impendence matching of the sensed electric sound signal, thereby supplying the processed signal through the connecting terminal to the outside. Here, the electric voltage pump 22 may be a DC-DC converter, and the buffer IC 24 may be an analogue amplifier or ADC. Referring to FIG. 4, a condenser symbol "C0" indicates an electrical equilibrium circuit for the MEMS chip 10. Here, the MEMS microphone package is connected with the external device through three connecting terminals (Vdd, GND, Output). The circuit diagram of FIG. 4 is applied to each embodiment in common.

According to the first embodiment of the present invention, the case 110 and the PCB 120 are welded by a laser, but they may be bonded by another means such as electric welding, soldering, conductive adhesive and the like.

Packaging Method

Figure 5:
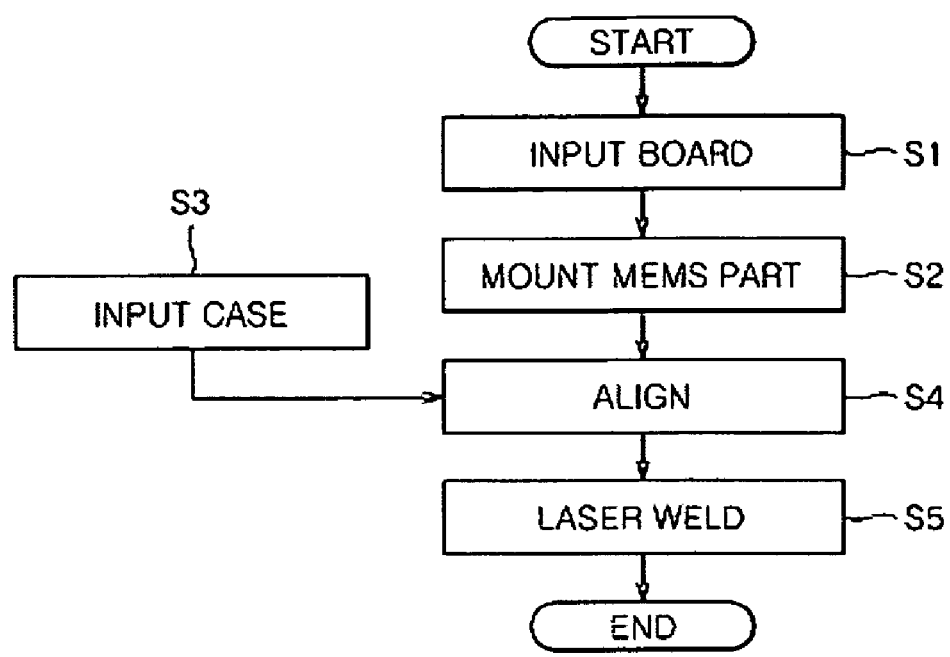
FIG. 5 is a flow chart showing a packaging process of a silicon based condenser microphone according to the present invention.

FIG. 5 is a flow chart showing a packaging process of a silicon based condenser microphone according to the present invention.

A method for packaging a silicon based condenser microphone according to the present invention, as shown in FIG. 5, includes the steps of inputting a board (S1), mounting a MEMS part and an ASIC chip on the board (S2), inputting a metal case (S3), aligning the case on a connecting pattern of the board (S4), and welding an opened end of the case to the connecting pattern of the board (S5).

Here, the board may be a PCB, a ceramic board, a FPCB or a metal PCB. The board is formed with the connecting pattern for connecting with the metal case. Meanwhile, although there is not shown in the drawing, the PCB 120 may be mounted with a capacitance or a resistance for shielding electromagnetic waves or ESD.

The metal case may be made of any one selected from the group of brass, copper, stainless steel, aluminum, nickel alloy and the like. Further, the metal case is preferably plated with Au or Ag. The metal case may have various shapes such as a circle, a square and the like. Further, in the step 5 (S5), the welding operation is performed by laser welding, but it may be substituted with electric welding, soldering, bonding using a conductive epoxy adhesive, (etc.). According to the packaging method of the present invention, the metal case is welded to the board by the laser, whereby a bonding force (that is, an electrical bonding force and sealing performance) is strengthened. As a result, a sound quality is enhanced, and the microphone has a high-resistance to noise from the outside. Process expense is saved, thereby sharply cutting total manufacturing cost.

Modification 2 of Embodiment 1

Figure 6:
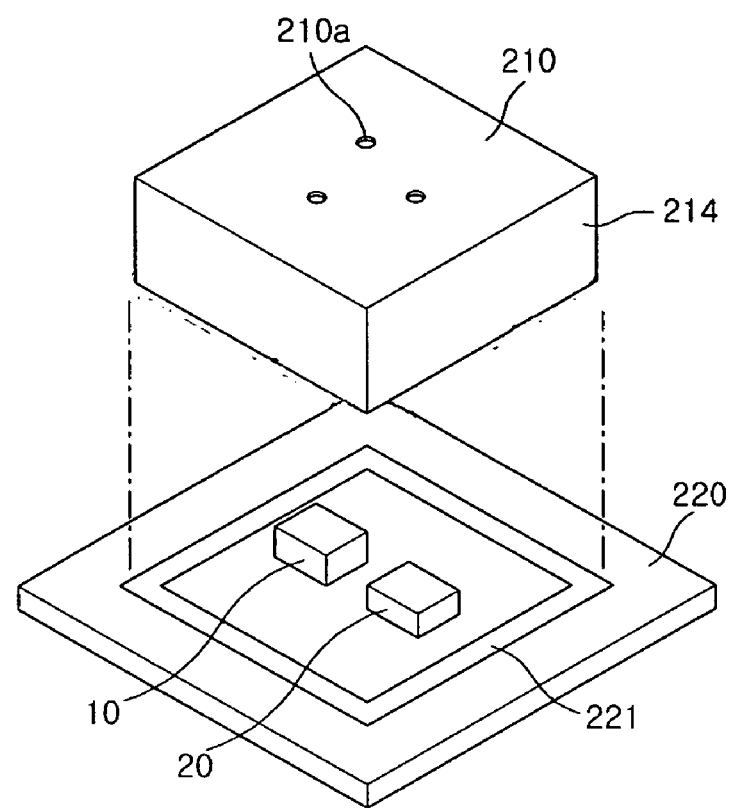
FIG. 6 is an exploded perspective view of a second modification of a first embodiment according to the present invention.

FIG. 6 is an exploded perspective view of a second modification of a first embodiment according to the present invention, wherein a rectangular parallelepiped shaped metal case 210 is welded to a PCB 220 by a laser.

Referring to FIG. 6, the PCB 220 is mounted with the MEMS chip 10 and the ASIC chip 20 and is formed with a rectangular connecting pattern 221 on a portion which contacts the metal case 210. The connecting pattern 221 is made of a copper clad film through a general PCB pattern forming technology.

The metal case 210 has a rectangular parallelepiped shape having an opening which faces the PCB 220, wherein an upper surface thereof is formed with a sound hole 210a for collecting sound.

After aligning the metal case 210 on the connecting pattern 221 of the PCB 220, a connecting portion therebetween is welded by a laser (not shown), whereby microphone packaging is finished. Here, the connecting pattern 221 is connected with a ground terminal, wherein, if the metal case 210 is welded to the connecting pattern 221, there is merit in that it is easy to eliminate noise by shutting out noise from the outside.

Since a MEMS chip of the microphone assembly which is packaged as described above has the same structure as the MEMS chip shown in FIG. 3, the further explanation will be omitted to avoid a repetition.

Modification 3 of Embodiment 1

Figure 7:
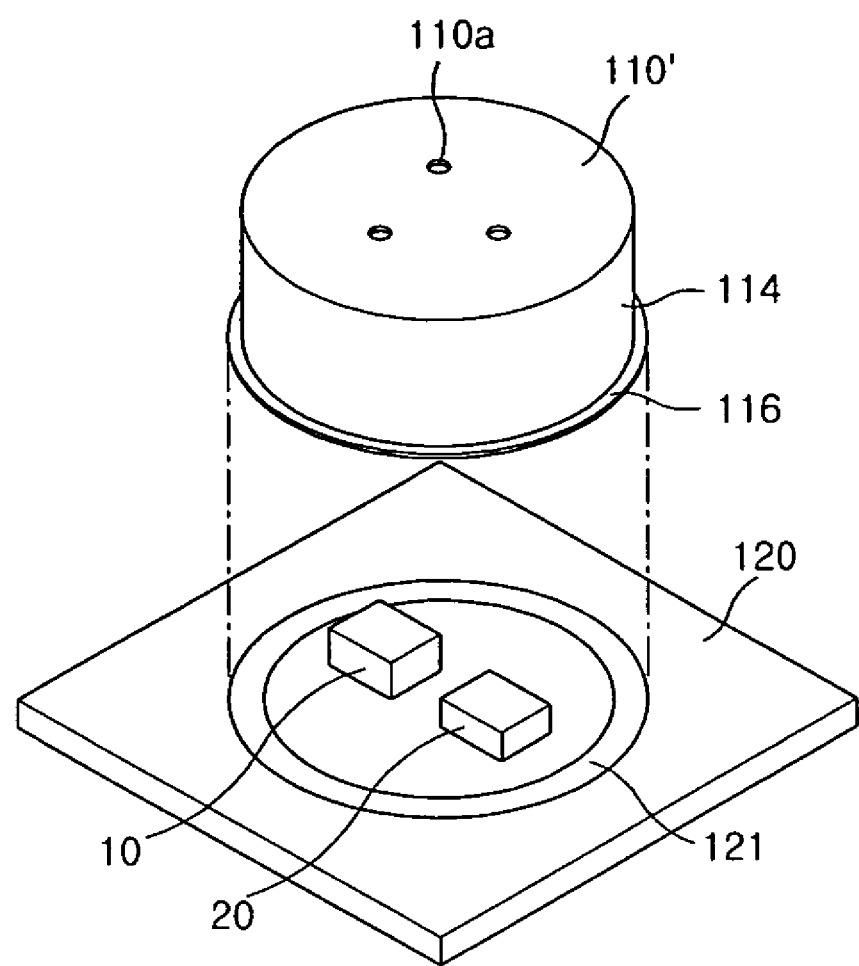
FIG. 7 is an exploded perspective view of a third modification of a first embodiment according to the present invention.

FIG. 7 is an exploded perspective view of a third modification of a first embodiment according to the present invention, wherein a cylindrical metal case 110 which is formed with a skirt 116 projected in a shape of "└" from an opened end of the case is welded to a PCB 120 by a laser.

Referring to FIG. 7, the PCB 120 is mounted with the MEMS chip 10 and the ASIC chip 20 and is formed with a circular connecting pattern 121 on a portion which contacts the metal case 110'. Since the PCB 120 is broader than the metal case 110, connecting pads or connecting terminals for connecting with an external device can be freely disposed on the broad PCB. Preferably, the connecting pattern is formed by forming copper cladding through a PCB manufacturing process and then plating the copper clad with Ni or Au. Preferably, the width of the connecting pattern 121 according to the third modification is wider than that of the connecting pattern of the first modification to correspond to the skirt 116 of the metal case.

The metal case 110' has a cylindrical shape having an opening which faces the PCB 120, wherein an upper surface thereof is formed with a sound hole 110a for collecting sound. A case body 114 is formed with the skirt 116 projected outwardly on the opened end thereof. After aligning the skirt 116 of the metal case 110' on the connecting pattern 121 of the PCB, a connecting portion therebetween is welded by a laser (not shown), whereby microphone packaging is finished.

Modification 4 of Embodiment 1

Figure 8:
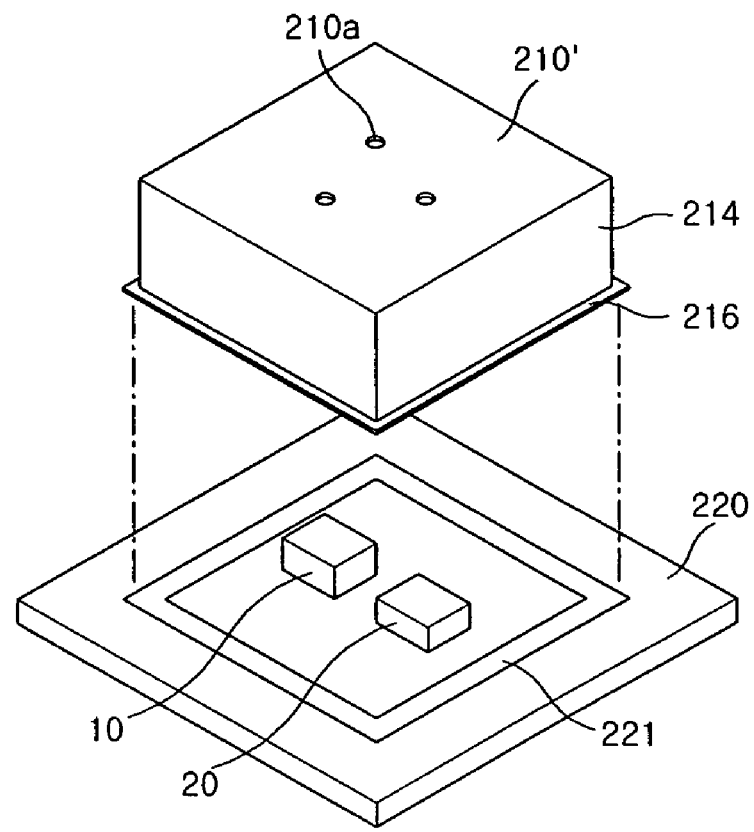
FIG. 8 is an exploded perspective view of a fourth modification of a first embodiment according to the present invention.

FIG. 8 is an exploded perspective view of a fourth modification of a first embodiment according to the present invention, wherein a rectangular parallelepiped shaped metal case 210 which is formed with a skirt 216 projected in a shape of "└" from an opened end of the case is welded to a PCB 220 by a laser.

Referring to FIG. 8, the PCB 220 is mounted with the MEMS chip 10 and the ASIC chip 20 and is formed with a rectangular connecting pattern 221 on a portion which contacts the metal case 210'. Since the PCB 220 is broader than the metal case 210' connecting pads or connecting terminals for connecting with an external device can be freely disposed on the broad PCB. Preferably, the connecting pattern 221 is formed by forming a copper clad through a PCB manufacturing process and then plating the copper clad with Ni or Au. Preferably, the width of the connecting pattern 221 according to fourth modification of a first embodiment is wider than that of the connecting pattern of the second embodiment to correspond to the skirt 216 of a body 214 of the metal case 210'.

The metal case 210' has a rectangular parallelepiped shape having an opening which faces the PCB 220, wherein an upper surface thereof is formed with a sound hole 210a for collecting sound. The case body 214 is formed with the skirt 216 projected outwardly on the opened end thereof.

After aligning the skirt 216 of the metal case on the connecting pattern 221 of the PCB, a connecting portion therebetween is welded by a laser (not shown), whereby microphone packaging is finished.

Modification 5 of Embodiment 1

Figure 9:
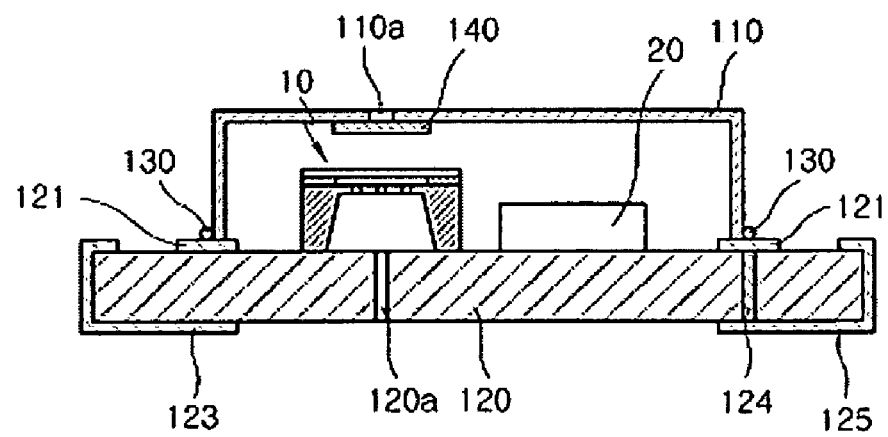
FIG. 9 is a sectional side view of a fifth modification of a first embodiment according to the present invention.

FIG. 9 is a sectional side view of a fifth modification of a first embodiment according to the present invention.

According to the fifth modification of a first embodiment of the present invention, provided is a structure having directivity by forming a front sound inlet hole 110a on a portion of the metal case 110 which corresponds to a portion where the MEMS chip 10 is positioned in the first embodiment to the fourth embodiment and forming a rear sound inlet hole 120a which is formed on a portion of the PCB where the MEMS chip 10 is mounted and then adding a sound resistor 140 to the inside and outside of the front sound inlet hole 110a or the inside of the rear sound inlet hole 120a.

According to the packaged directional microphone assembly, as shown in FIG. 9, the metal case 110 is firmly adhered to the connecting pattern 121 of the PCB 120 which is mounted with the MEMS chip 10 and the ASIC chip 20 by laser welding, wherein a space 150 between the metal case 110 and the PCB 120 is served as a sound chamber.

The metal case 110 is formed with the front sound inlet hole 110a for collecting front sound on a portion thereof corresponding to a position of the MEMS chip 10, and the PCB 120 is formed with a rear sound inlet hole 120a for collecting rear sound at a portion thereof corresponding to a portion where the MEMS chip 10 is mounted. The sound resistor 140 is attached to the inside of the front sound inlet hole 110a. Further, the PCB 120 may be formed with connecting terminals 123 and 125 for connecting with the external device on a bottom surface thereof, wherein the number of the connecting terminals 123 and 125 may be two to eight. Each of the connecting terminals 123 and 125 is electrically connected through a through-hole 124 to a "chip part" surface of the PCB. According to an embodiment of the present invention, if extending the connecting terminals 123 and 125 to a circumference of the PCB 120, an electric soldering iron may be contacted to an exposed surface of the terminal, whereby a rework operation can be easily performed.

According to the fifth modification of a first embodiment, the sound resistor 140 is positioned at the inside of the front sound inlet hole 110a, but it may be positioned at the outside of the front sound inlet hole 110a or the inside or the outside of the rear sound inlet hole 120a. According to this structure of the fifth modification of a first embodiment, sound collected through the front sound inlet hole 110a or the rear sound inlet hole 120a passes through the sound resistor 140 and then its phase is changed, thereby obtaining directivity.

Embodiment 2

Modification 1 of Embodiment 2

Figure 10:
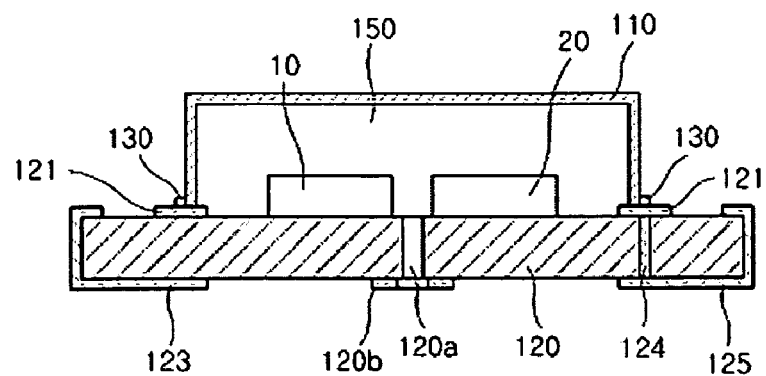
FIG. 10 is a sectional side view of a first modification of a second embodiment according to the present invention.
Figure 11:
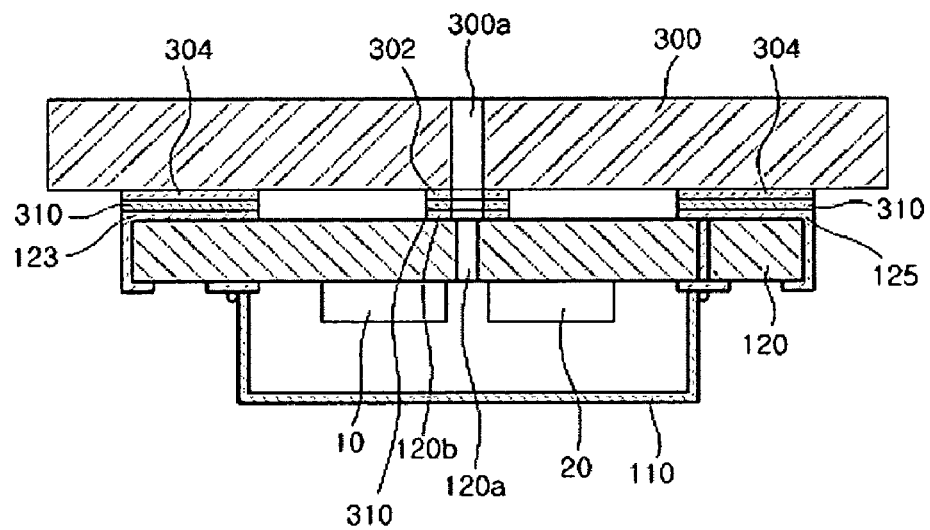
FIG. 11 is a sectional side view of mounting example of microphone of FIG. 10.
Figure 12:
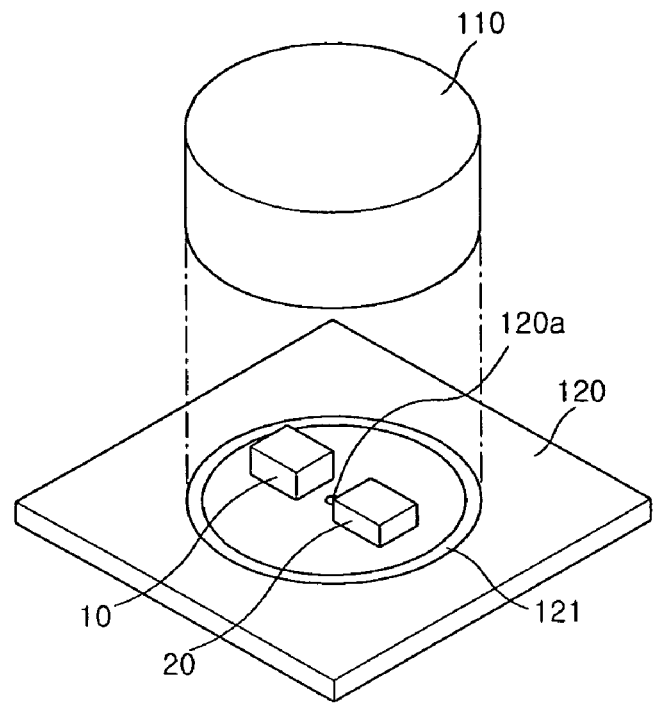
FIG. 12 is an exploded perspective view of a first modification of a second embodiment according to the present invention.

FIG. 10 is a sectional side view of a first modification of a second embodiment according to the present invention, FIG. 11 is a sectional side view showing that a microphone shown in FIG. 10 is mounted on a main PCB, and FIG. 12 is an exploded perspective view of a first modification of a second embodiment according to the present invention.

According to a first modification of a second embodiment according to the present invention, as shown in FIGS. 10 and 12, there is provided an example that a cylindrical metal case 110 is welded to a PCB 120 which is mounted with a MEMS chip 10 and an ASIC chip 20 by a laser.

Referring to FIGS. 10 and 12, the PCB 120 is formed with a sound hole 120a for collecting an external sound near the center thereof and is mounted with the MEMS chip 10 and the ASIC chip 20 around the center thereof. Further, the PCB is formed with a circular connecting pattern 121 on its portion which contacts the metal case 110. Meanwhile, if necessary, the board may be mounted with a capacitance or a resistance, which is not shown in the drawing, for shielding electromagnetic waves or ESD.

Since the PCB 120 is broader than the metal case 110, connecting pads or connecting terminals for connecting with an external device can be freely disposed on the broad PCB. The connecting pattern 121 is formed by forming a copper cladding through a general PCB manufacturing process and then plating the copper clad with Ni or Au. Here, the board 120 may be a PCB, a ceramic board, a FPCB or a metal PCB.

The metal case 110 has a cylindrical shape having an opening which faces the PCB 120 to receive the chip parts therein. Since the metal case has a structure for collecting a sound through the sound hole 120a of the PCB, a bottom surface of the metal case is closed. The metal case is made of any one selected from the group of brass, copper, stainless steel, aluminum, nickel alloy and the like. Further, the metal case may be plated with Au or Ag. The metal case may have various shapes such as a circle, a square and the like.

After aligning the metal case 110 on the connecting pattern 121 of the PCB 120, a connecting portion therebetween is welded by a laser (not shown), thereby finishing a microphone package. Here, the connecting pattern 121 is connected with a ground terminal 125, wherein, if the metal case 110 is welded to the connecting pattern 121, there is merit in that it is easy to eliminate noise by interrupting noise collected from the outside.

According to the packaged microphone assembly, as shown in FIG. 10, the metal case 110 is firmly adhered to the connecting pattern 121 of the PCB 120 by a laser welding, wherein a space 150 between the metal case 110 and the PCB 120 functions as a sound chamber. Further, the PCB 120 is formed with the sound hole 120a for collecting the external sound, wherein the PCB is formed with a sealing terminal 120b for sealing the sound hole 120a by soldering around the sound hole of a bottom surface of the PCB 120 to prevent distortion of a sound wave generated in a space between a main PCB 300 and the microphone. Here, the number of the connecting terminals 123 and 125 for connecting with the external device may be two to eight. Each of the connecting terminals 123 and 125 may be electrically connected through through-hole 124 to a "chip part" surface of the PCB 120. According to an embodiment of the present invention, if extending the connecting terminals 123 and 125 to a circumference of the PCB 120, an electric soldering iron can be contacted to an exposed surface of the terminal, whereby a rework operation can be easily performed.

An example that the microphone according to the present invention is mounted on the main PCB 300 is shown in FIG. 11.

Referring to FIG. 11, the main PCB 300 where the microphone is mounted is formed with a main sound hole 300a for collecting the external sound, wherein the main PCB is formed with a sealing terminal 302 for sealing the main sound hole 300a by soldering around the main sound hole thereof to prevent distortion of a sound wave generated in a space between a main PCB 300 and the microphone. Further, the main PCB 300 is formed with connecting pads 304 corresponding to the connecting terminals 123 and 125 of the microphone. If connecting the microphone according to the present invention with the main PCB 300 by a solder 310, the external sound is collected through the main sound hole 300a of the main PCB 300 and then passes through an area sealed by the sealing terminal 302. Then, the external sound is collected through the sound hole 120a of the microphone PCB 120 to the inside of the microphone.

According to a first modification of a second embodiment according to the present invention, the case 110 and the PCB 120 are welded by a laser, but they may be bonded by another means such as electric welding, soldering, adhering by a conductive adhesive and the like.

Modification 2 of Embodiment 2

Figure 13:
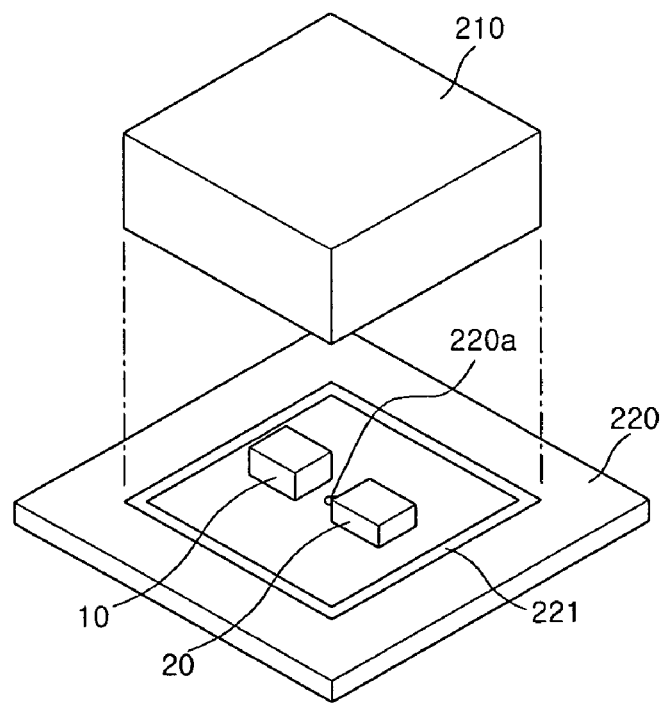
FIG. 13 is an exploded perspective view of a second modification of a second embodiment according to the present invention.

FIG. 13 is an exploded perspective view of a second modification of a second embodiment according to the present invention, wherein a rectangular parallelepiped shaped metal case 210 is welded to a PCB 220 by a laser.

Referring to FIG. 13, the PCB 220 is formed with a sound hole 220a for collecting an external sound and is mounted with the MEMS chip 10 and the ASIC chip 20 around the sound hole 220a. Further, the PCB is formed with a rectangular connecting pattern 221 on its portion which contacts the metal case 210. The connecting pattern 221 is formed of a copper cladding film by a general PCB pattern forming technology. Although not shown in the drawing, the PCB is formed with a sealing terminal for sealing the sound hole by soldering around the sound hole of a bottom surface of the PCB 220 to prevent distortion of a sound wave generated in a space between the main PCB 300 in FIG. 11 and the microphone.

The metal case 210 has a rectangular parallelepiped shape having an opening which faces the PCB 220, wherein, since the external sound is collected through the sound hole 220a of the PCB, the bottom surface of the case is closed.

After aligning the metal case 210 on the connecting pattern 221 of the PCB 220, a connecting portion therebetween is welded by a laser (not shown), thereby finishing packaging of the microphone. Here, the connecting pattern 221 is connected with a ground terminal, wherein, if the metal case 210 is welded to the connecting pattern 221, there is merit in that it is easy to eliminate noise itself by interrupting noise collected from the outside.

Since a microphone assembly which is packaged as described above has the same structure as the assembly shown in FIG. 10, further explanation will be omitted to avoid a repetition.

Modification 3 of Embodiment 2

Figure 14:
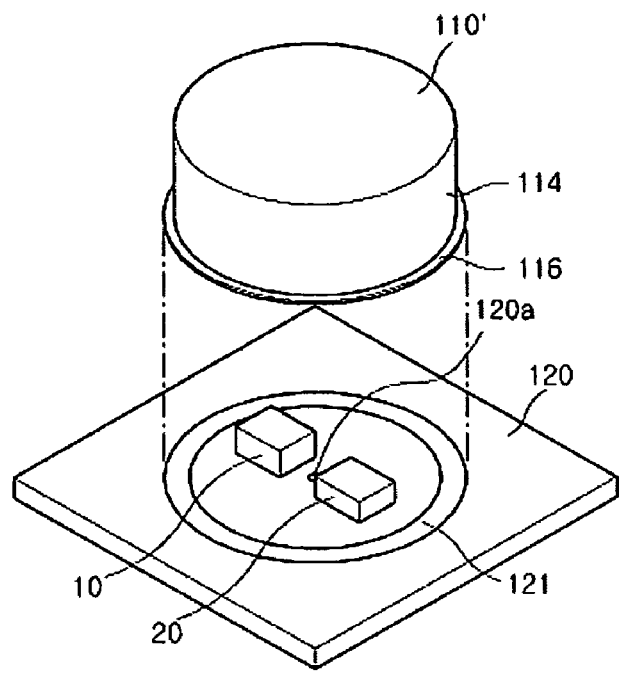
FIG. 14 is an exploded perspective view of a third modification of a second embodiment according to the present invention.

FIG. 14 is an exploded perspective view of a third modification of a second embodiment according to the present invention, wherein a cylindrical metal case 110' which is formed with a skirt 116 projected in a shape of "∟" from an opened end of the case is welded to a PCB 120 by a laser.

Referring to FIG. 14, the PCB 120 is formed with a sound hole 120a for collecting an external sound and is mounted with the MEMS chip 10 and the ASIC chip 20. Further, the PCB is formed with a circular connecting pattern 121 on its portion which contacts the metal case 110'. Although not shown in the drawing, the PCB 120 is formed with a sealing terminal for sealing the sound hole by soldering around the sound hole 120a of a bottom surface of the PCB 120 to prevent distortion of a sound wave generated in a space between the main PCB 300 in FIG. 11 and the microphone. Since the PCB 120 is broader than the metal case, connecting pads or connecting terminals for connecting with an external device can be freely disposed on the broad PCB. Preferably, the connecting pattern is formed by forming a copper cladding through a general PCB manufacturing process and then plating the copper clad with Ni or Au. Further, preferably, the width of the connecting pattern 121 according to the third modification is wider than that of the connecting pattern of the first modification of a second embodiment to correspond to the skirt 116 of the metal case.

The metal case 110' of third modification of a second embodiment has a circular shape having an opening which faces the PCB 120, wherein, since the external sound is collected through the sound hole 120a of the PCB, a bottom surface of the case is closed. Further, a body 114 of the case 110' is formed with the skirt 116 projected outwardly on the opened end thereof. After aligning the skirt 116 of the metal case 110' on the connecting pattern 121 of the PCB, a connecting portion therebetween is welded by a laser (not shown), whereby microphone packaging is finished.

Modification 4 of Embodiment 2

Figure 15:
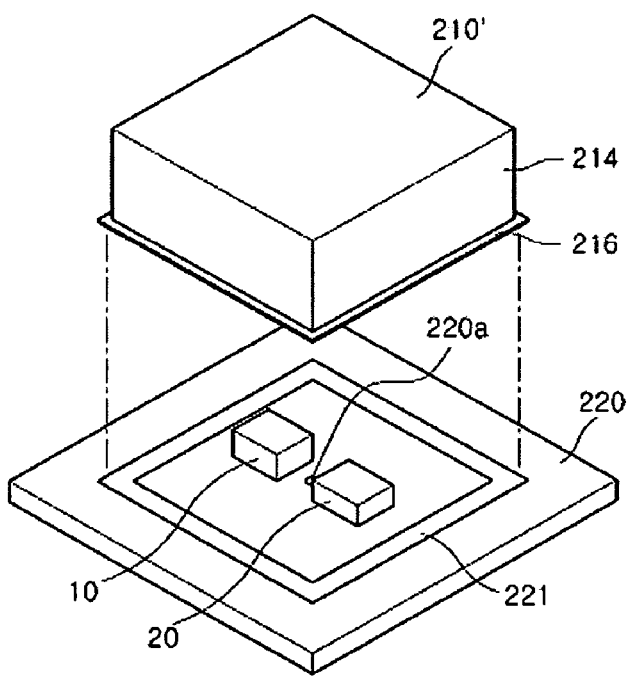
FIG. 15 is an exploded perspective view of a fourth modification of a second embodiment according to the present invention.

FIG. 15 is an exploded perspective view of a fourth modification of a second embodiment according to the present invention, wherein a rectangular parallelepiped shaped metal case 210' which is formed with a skirt 216 projected in a shape of "∟" from an opened end of the case is welded to a PCB 220 by a laser.

Referring to FIG. 15, the PCB 220 is formed with a sound hole 220a for collecting an external sound and is mounted with the MEMS chip 10 and the ASIC chip 20. Further, the PCB is formed with a rectangular connecting pattern 221 on its portion which contacts the metal case 210'. Although there is not shown in the drawing, the PCB 220 is formed with a sealing terminal for sealing the sound hole by soldering around the sound hole 220a of a bottom surface of the PCB 220 to prevent distortion of a sound wave generated in a space between the main PCB 300 in FIG. 11 and the microphone. Since the PCB 220 is broader than the metal case 210, connecting pads or connecting terminals for connecting with an external device can be freely disposed on the broad PCB. Preferably, the connecting pattern 221 is formed by forming a copper cladding through a PCB manufacturing process and then plating the copper clad with Ni or Au. Preferably, the width of the connecting pattern 221 according to the fourth modification of a second embodiment is wider than that of the connecting pattern of the second embodiment to correspond to the skirt 216 of a body 214 of the metal case 210'. The metal case 210' has a shape of a rectangular parallelepiped having an opening which faces the PCB 220, wherein, since the external sound is collected through the sound hole 220a of the PCB, a bottom surface of the case 210' is closed. Further, a body 214 of the case is formed with the skirt 216 projected outwardly on the opened end thereof.

After aligning the skirt 216 of the metal case on the connecting pattern 221 of the PCB, a connecting portion therebetween is welded by a laser (not shown), whereby microphone packaging is finished.

Modification 5 of Embodiment 2

Figure 16:
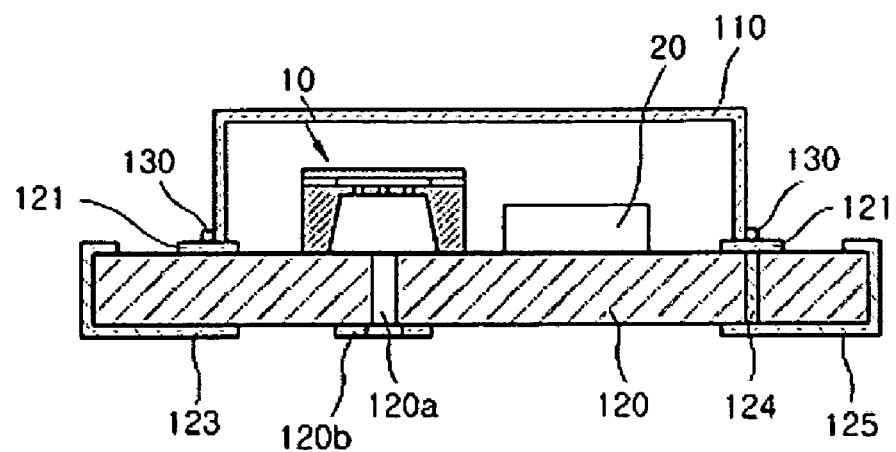
FIG. 16 is a sectional side view of a fifth modification of a second embodiment according to the present invention.

FIG. 16 is a sectional side view of a fifth modification of a second embodiment according to the present invention, wherein a PCB is formed with a sound hole on a portion where a MEMS chip is positioned.

Referring to FIG. 16, the metal case 110 is firmly attached to the connecting pattern 121 of the PCB 120 which is mounted with the MEMS chip 10 and the ASIC chip 20 by laser welding.

Further, the PCB 120 is formed with the sound hole 120a for collecting an external sound on a position where the MEMS chip 10 is mounted, and is formed with the sealing terminal 120a for sealing the sound hole 120a by soldering on the outside of the sound hole to prevent distortion of a sound wave in a space between the main PCB 300 and the microphone. Further, the PCB 120 may be formed with the connecting terminals 123 and 125 for connecting with the external device on a bottom surface thereof, wherein the number of the connecting terminals 123 and 125 may be two to eight. Each of the connecting terminals 123 and 125 is electrically connected through through-hole 124 to a "chip part" surface of the PCB 120. According to the embodiment of the present invention, if extending the connecting terminals 123 and 125 to a circumference of the PCB 120, an electric soldering iron may be contacted to an exposed surface of the terminals, whereby a rework operation can be easily performed.

According to the structure of the fifth modification of a second embodiment, the external sound collected through the sound hole 120a passes through the sound hole of the back plate 13 of the MEMS chip 10 and then vibrates the sound plate 11 to generate an electrical signal. Although not shown in the drawing, in order to mount the microphone on the main PCB 300, the PCB 300 is formed with a hole corresponding the sound hole 120a and further is formed with a sealing terminal for sealing the hole by soldering around the hole of the PCB 300 to prevent distortion of a sound wave generated in a space between the main PCB 300 in FIG. 300 and the microphone.

Modification 6 of Embodiment 2

Figure 17:
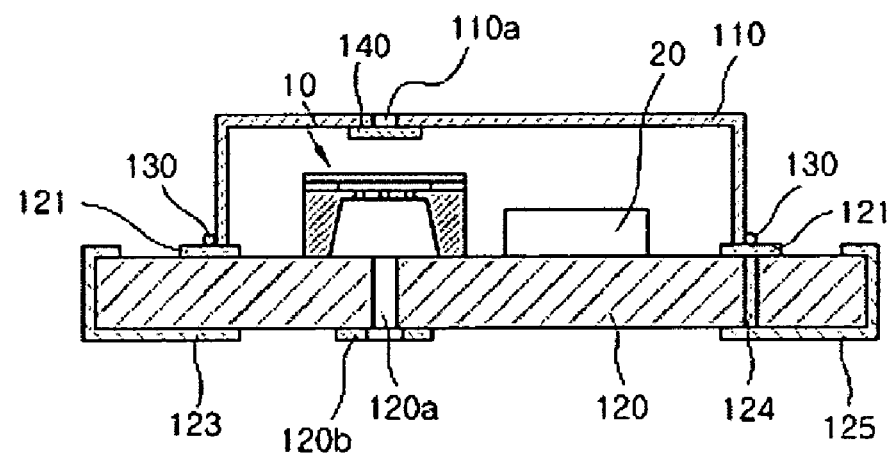
FIG. 17 is a sectional side view of a sixth modification of a second embodiment according to the present invention.

FIG. 17 is a sectional side view of a sixth modification of a second embodiment according to the present invention. In the embodiment of the present invention, while a sound collected from a PCB side is called a front sound, a sound collected from a case side is called a rear sound.

According to the sixth modification of a second embodiment of the present invention, provided is a structure having directivity by forming a front sound inlet hole 120a on the portion of the PCB 120 which corresponds to a portion where the MEMS chip 10 is mounted in the fifth embodiment and forming a rear sound inlet hole 110a on the portion of the metal case 110 which corresponds to a portion where the MEMS chip 10 is positioned and then adding a sound resistor 140 to the inside of the front sound inlet hole 120a or the inside and outside of the rear sound inlet hole 110a.

Referring to FIG. 17, in the packaged directional microphone assembly, the metal case 110 is firmly attached to the connecting pattern of the PCB 120 which is mounted with the MEMS chip 10 and the ASIC chip 20 by laser welding.

The PCB 120 is formed with the front sound inlet hole 120a for collecting front sound on the portion thereof corresponding to a portion where the MEMS chip 10 is mounted. The metal case 110 is formed with the rear sound inlet hole 110a for collecting rear sound on the portion thereof corresponding to a position of the MEMS chip 10. The sound resistor 140 is attached to the inside of the rear sound inlet hole 110a. Further, the PCB 120 is formed with the sealing terminal 120a for sealing the sound hole 120a by soldering around the outside of the sound hole to prevent distortion of a sound wave in a space between the main PCB 300 and the microphone. Further, the PCB 120 may be formed with the connecting terminals 123 and 125 for connecting with the external device on a bottom surface thereof, wherein the number of the connecting terminals 123 and 125 may be two to eight. Each of the connecting terminals 123 and 125 may be electrically connected through through-hole 124 to a "chip part" surface of the PCB 120.

According to this structure of the sixth modification of a second embodiment, the sound collected through the front sound inlet hole 120a or the rear sound inlet hole 110a passes through the sound resistor 140 and then its phase is changed, thereby obtaining directivity.

Embodiment 3

Modification 1 of Embodiment 3

Figure 18:
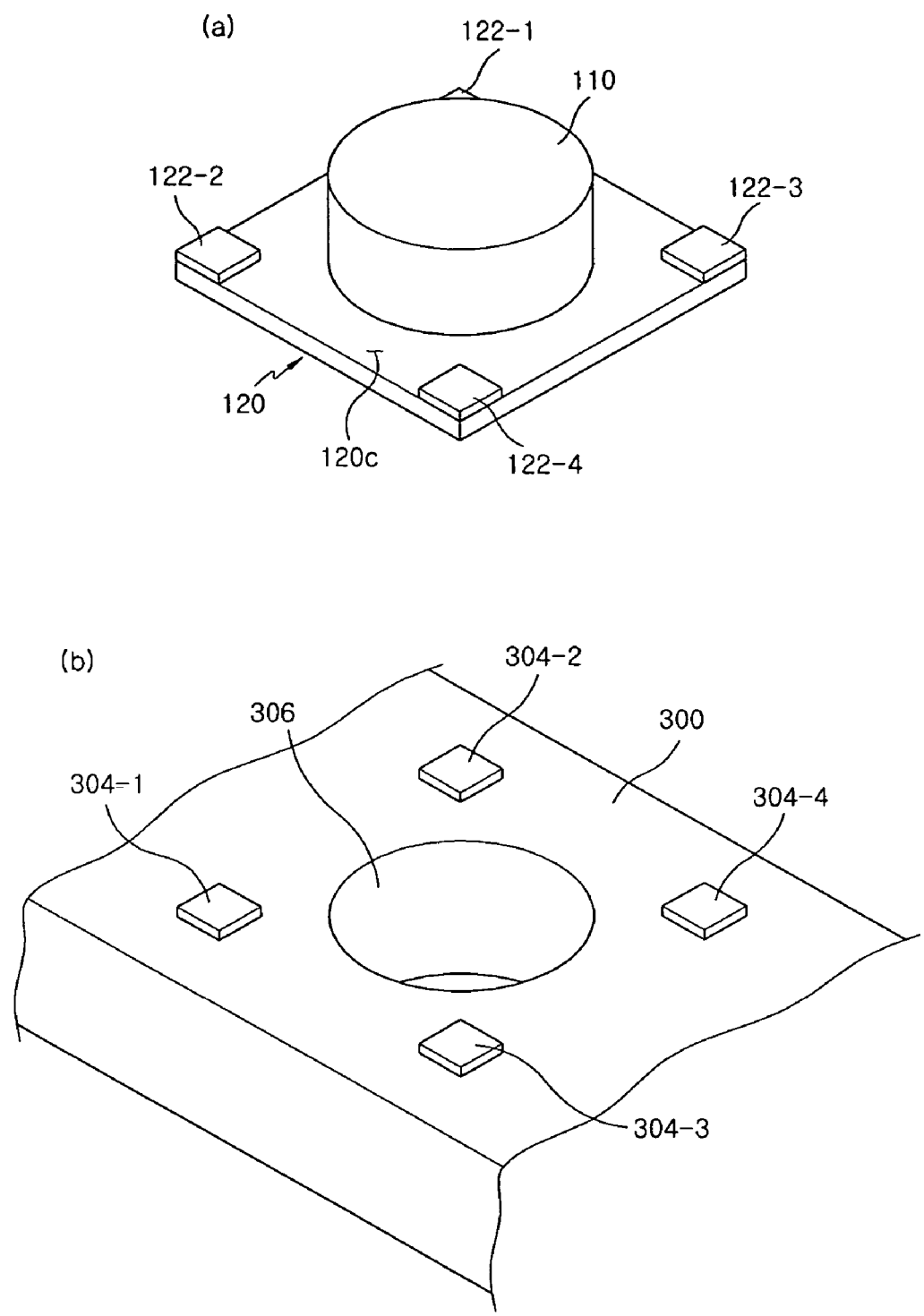
FIG. 18 is a perspective view of a first modification of a third embodiment according to the present invention.
Figure 19:
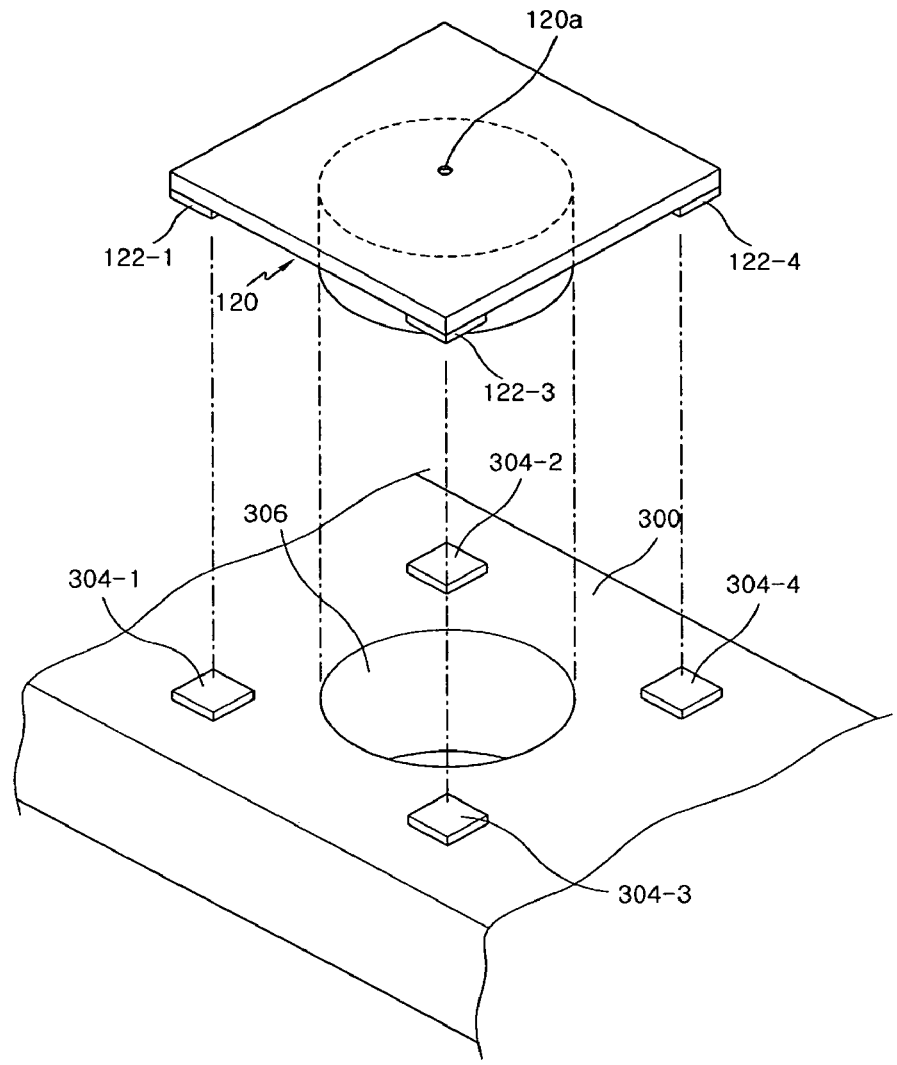
FIG. 19 is a sectional side view of mounting a silicon based condenser microphone according to a third embodiment of the present invention.
Figure 20:
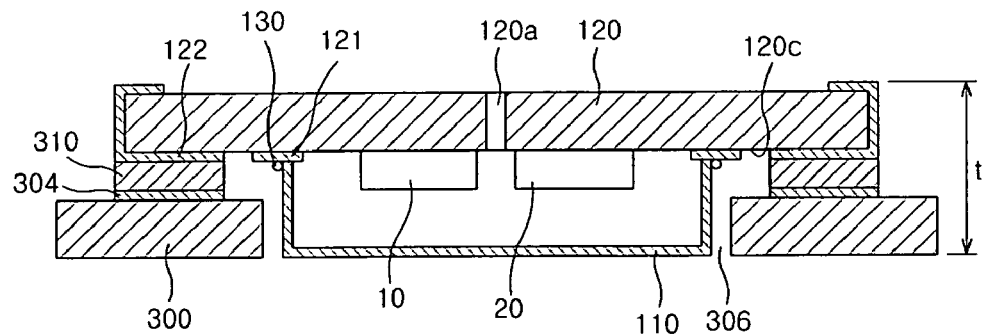
FIG. 20 is a sectional side view showing that a silicon based condenser microphone according to a third embodiment according to the present invention is mounted.

FIG. 18 is a perspective view of a first modification of a third embodiment according to the present invention, FIG. 19 is a sectional side view of mounting a silicon based condenser microphone according to a third embodiment of the present invention, and FIG. 20 is a sectional side view showing that a silicon based condenser microphone according to a third embodiment according to the present invention is mounted.

According to a silicon based condenser microphone, as shown in FIG. 18, a cylindrical metal case 10 having a bottom surface which is closed is attached to a board 120 which is broader than the metal case 10, wherein the board is formed with connecting pads 122-1 to 122-4 which are connected with connecting pads 304-1 to 304-4 of a main PCB 300 of a product using the microphone on a part side 120c thereof. In the embodiment of the present invention, four connecting terminals are provided, but the number is merely an example. That is, two to eight connecting terminals may be provided. Further, if extending the connecting terminals 122-1 and 122-4 to a circumference of the PCB 120 or the reverse side of the part side, a heat transfer of an electric iron and the like is improved, whereby a rework operation can be more convenient.

The main PCB 300 where the silicon based condenser microphone is mounted, as shown in FIG. 18, is formed with a circular inserting hole 306 for mounting the case 110 of the silicon based condenser microphone and the connecting pads 304-1 to 304-4 corresponding to the connecting terminals 122-1 to 122-4 which is formed on the board 120 of the microphone. Then, an example for mounting the silicon based condenser microphone on the main PCB 300 will be explained with reference to FIG. 19. Referring to FIG. 19, the part side 120c of the microphone board which is formed with a sound hole 120a for collecting sound from the outside and the connecting terminals 122-1 to 122-4 is provided with the metal case 110 having the bottom surface which is closed faces the main PCB 300 and then the case 110 of the microphone is inserted into the hole 306 of the main PCB 210. Then, the connecting pads 304-1 to 304-4 are connected with the connecting pads 122-1 to 122-4 by a soldering operation.

As such, according to a structure of FIG. 20 showing that the silicon based condenser microphone is mounted on the main PCB 300, the metal case 110 projected from the central portion of the part side 120c of the board is inserted the inserting hole 306 of the main PCB 300 and the connecting pads 304 of the main PCB and the connecting terminals 122 of the microphone are connected by a solder 310.

Thus, according to a mounting method of the present invention, since the case 110 projected from the board of the microphone is inserted into the inserting hole 306 of the main PCB 300, a total height t of an assembly according to the present invention is lower than that of an assembly assembled when the conventional microphone having the board which is formed with the connecting terminals on the reverse side of the part side thereof, thereby efficiently saving space for mounting a part of the product.

Referring again to FIG. 20, the board 120 is mounted with a MEMS chip 10 and an ASIC chip 20 within the metal case of the silicon based condenser microphone. Further, the board 120 is formed with a sound hole 120a for collecting sound from the outside in the central portion thereof and is formed with a circular connecting pattern 121 on the portion thereof which contacts the metal case 110 having the closed bottom side.

Meanwhile, although not shown in the drawing, if necessary, the board may be mounted with a capacitance or a resistance for shielding electromagnetic waves or ESD. Here, the board 120 may be selected among a PCB, a ceramic board, a FPCB, a metal PCB and the like. The metal case may be made of any one selected from the group of brass, copper, stainless steel, aluminum, nickel alloy and the like. Further, the metal case may be plated with Au or Ag. Further, as shown in FIG. 20, if extending the connecting terminal 122 through the circumferential part to the reverse side of the part side, heat transfer of an electric iron is improved, whereby a rework operation can be more easily performed. Meanwhile, although not shown in the drawing, the connecting terminal 122 may be extended up to the circumferential part of the board.

Modification 2 of Embodiment 3

Figure 21:
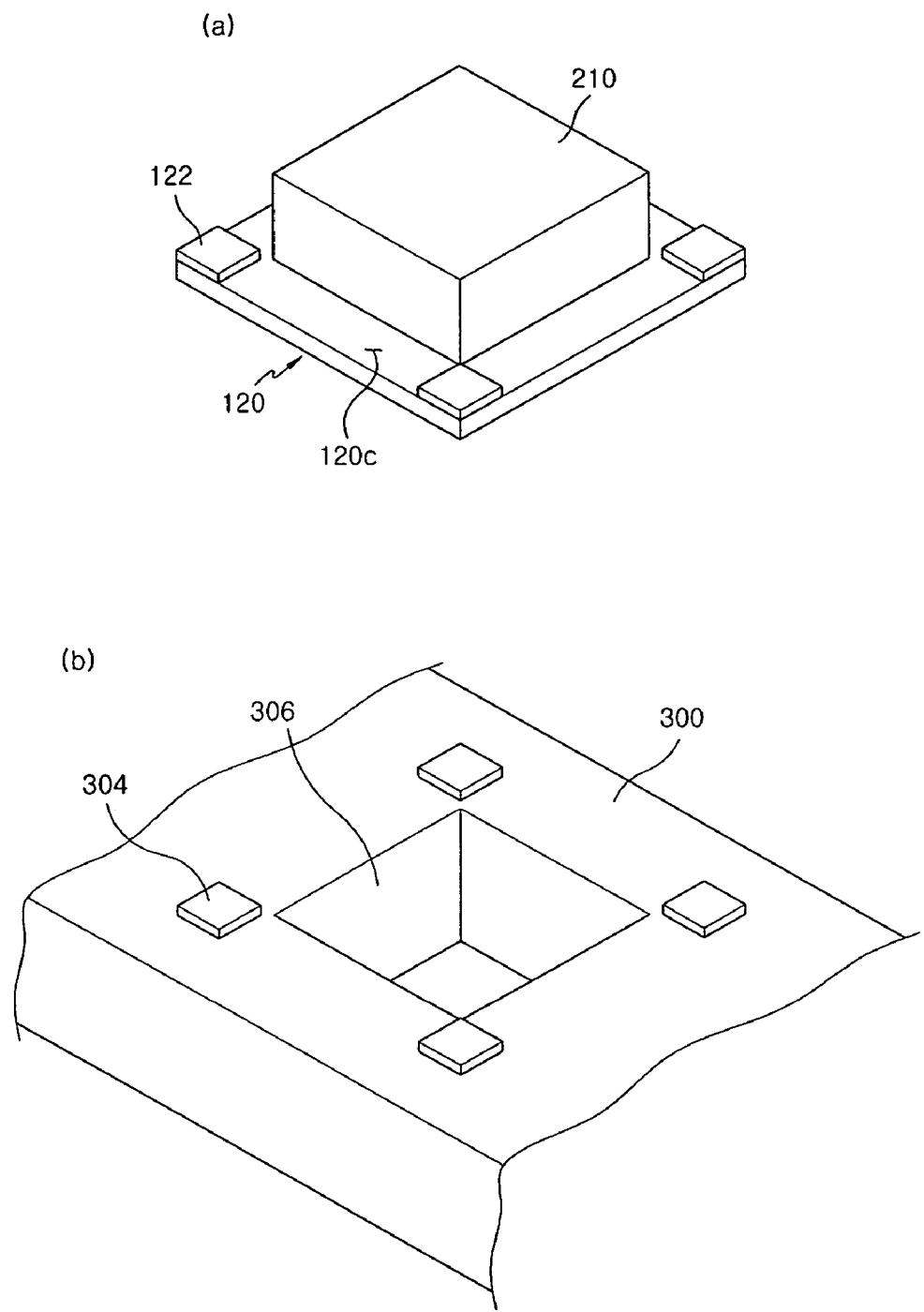
FIG. 21 is a perspective view of a second modification of a third embodiment according to the present invention.

FIG. 21 is a perspective view of a second modification of a third embodiment according to the present invention, wherein FIG. 21 section (a) shows a silicon based condenser microphone including a rectangular parallelepiped shaped metal case having a bottom side which is closed, and FIG. 21 section (b) shows a main PCB 300 of a product for mounting the silicon based condenser microphone having the rectangular parallelepiped shaped metal case.

According to the silicon based condenser microphone of the second modification of a third embodiment of the present invention, the rectangular parallelepiped shaped metal case 210 having the closed bottom side is attached to a board 120, wherein the board is formed with connecting pads 122 which are connected with connecting pads 304 of a main PCB of a product using the microphone on a part side 120c thereof. Further, there is not shown in the drawing, the board 120 is formed with a sound hole 120a for collecting sound from the outside on the central portion thereof.

The main PCB 300 of the product where the silicon based condenser microphone is mounted, as shown in FIG. 21, is formed with a rectangular inserting hole 306 for mounting the case 210 of the silicon based condenser microphone and the connecting pads 304 corresponding to the connecting terminals 122 which are formed on the board 120 of the microphone.

Then, a process for mounting the silicon based condenser microphone on the main PCB 300 will be explained with reference to FIG. 18. The mounting includes the steps of preparing the main PCB 300 which is formed with the hole 306 for inserting the microphone and the connecting pads 304 for electrically connecting with the microphone, preparing the condenser microphone having the board which is formed with the rectangular parallelepiped shaped metal case projected from the central portion of the part side 120c of the board and the connecting terminals 122 for connecting with the connecting pads 304 on the part side thereof and is formed with the sound hole 120a, and soldering the connecting pads 304 of the main PCB and the connecting terminals 122 of the microphone after inserting the case 210 of the condenser microphone into the hole 306 of the main PCB. This process is substantially identical to the mounting process of the first modification of a third embodiment except that the case has the rectangular parallelepiped shape.

Modification 3 of Embodiment 3

Figure 22:
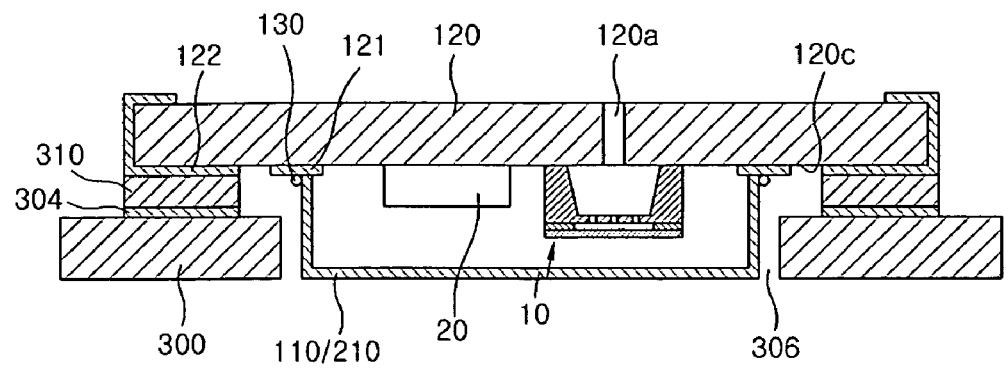
FIG. 22 is a sectional side view of a third modification of a third embodiment according to the present invention.

FIG. 22 is a sectional side view of a third modification of a third embodiment according to the present invention.

According to the silicon based condenser microphone shown in FIG. 22, the metal case 110/210 projected from the board is inserted in the hole 306 of the main PCB 300, and the connecting terminals 122 of the part side 120c of the microphone board are connected with the connecting pads 304 of the main PCB by a solder 310. Further, the board 120 is formed with a sound hole 120a for collecting sound from the outside on the position where the MEMS chip 10 is mounted.

Here, according to the silicon based condenser microphone of the first or the second modification of the third embodiment of the present invention, while the metal case 110/210 is not formed with the sound hole and the bottom side thereof is closed, the board is formed with the sound hole 120a for collecting sound from the outside on the position where the MEMS chip is mounted.

According to the structure shown in FIG. 22, the external sound collected through the sound hole 120a of the PCB passes through the sound hole of the back plate 13 of the MEMS chip 10 and then vibrates the sound plate 11 to generate an electrical signal.

Modification 4 of Embodiment 3

Figure 23:
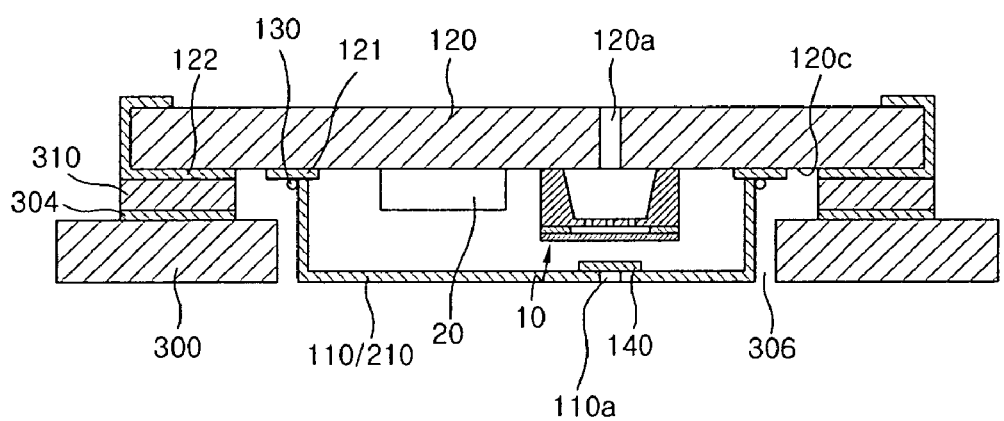
FIG. 23 is a sectional side view of a fourth modification of a third embodiment according to the present invention.

FIG. 23 is a sectional side view of a fourth modification of a third embodiment according to the present invention. In the embodiment of the fourth modification of a third embodiment according to the present invention, while a sound collected from a PCB side is called a front sound, a sound collected from a case side is called a rear sound.

According to the silicon based condenser microphone shown in FIG. 23, the metal case 110/210 projected from the board is inserted in the hole 306 of the main PCB 300, and the connecting terminals 122 of the part side 120c of the microphone board are connected with the connecting pads 304 of the main PCB by a solder 310. The microphone board 120 is formed with the front sound inlet hole 120a for collecting the front sound on the position where the MEMS chip 10 is mounted. The metal case 110/210 is formed with the rear sound inlet hole 110a for collecting the rear sound.

Here, according to the directional silicon based condenser microphone of the third embodiment according to the present invention, an additional sound resistor 140 is attached on the inside and outside of the front sound inlet hole 120a or the inside and outside of the rear sound inlet hole 110a so that the microphone has directivity.

According to this structure shown in FIG. 23, the sound collected through the front sound inlet hole 120a or the rear sound inlet hole 110a passes through the sound resistor 140 and then its phase is changed, thereby obtaining a directivity. From the foregoing, the metal case is welded to the board by laser, thereby strengthening a bonding force and thus enhancing a mechanical firmnness and highly resisting noise from the outside. As a result, process expense is saved, thereby sharply cutting a total manufacturing cost.

Further, a curling process for joining a metal case with a PCB is removed in a conventional microphone manufacturing process and the metal case is directly welded to the PCB which is mounted with condenser microphone parts, thereby enhancing an electrical conductivity between the case and the PCB and also enhancing a sound characteristic by sealing the case so that a sound pressure from the outside does not enter the case. Further, since a shape of the PCB is not limited by the size of the case, the PCB which is used for the microphone is freely designed, thereby forming various shapes of terminals. Further, since assembly work can be performed without physical force as applied in the curling process, a thinner PCB can be adapted. As a result, the height of a product can be lowered, whereby a thinner microphone can be manufactured.

While the present invention has been described in connection with what is presently considered to be the most practical and preferred embodiments, it is to be understood that the present invention is not limited to the disclosed embodiment, but, on the contrary, it is intended to cover various modifications and equivalent arrangements included within the spirit and scope of the appended claims.

Further, according to the silicon based condenser microphone which is mounted on the main PCB according to the present invention, since the case projected from the board of the microphone is inserted into the inserting hole of the main PCB, the total height of the assembly after mounting the microphone of the present invention is lower than that of the conventional assembly, thereby efficiently saving part space within the product.

The invention claimed is:

1. A silicon based condenser microphone comprising:
   a metal case;
   a board which is mounted with a Micro Electro Mechanical System (MEMS) microphone chip and an application specific integrated circuit (ASIC) chip having a electric voltage pump and a buffer IC and is formed with a connecting pattern for bonding with the metal case, the connecting pattern being welded to the metal case; and
   at least one connecting terminal connected with the connecting pattern, the connecting terminal extending to a circumference of the board.

2. The silicon based condenser microphone according to claim 1, wherein the metal case has any one of a cylindrical shape and a rectangular parallelepiped shape.

3. The silicon based condenser microphone according to claim 2, wherein an opened end of the metal case has any one of a straight line shape and a skirt shape which is formed by bending the opened end outwardly.

4. The silicon based condenser microphone according to claim 1, wherein the board is any one selected from the group of a printed circuit board (PCB), a ceramic board, a flexible PCB (FPCB) and a metal PCB.

5. The silicon based condenser microphone according to claim 1, wherein the metal case is made of any one selected from the group of brass, aluminum and nickel alloy.

6. The silicon based condenser microphone according to claim 1, wherein the welding is laser welding.

7. The silicon based condenser microphone according to claim 1, wherein the welding is electric welding.

8. The silicon based condenser microphone according to claim 1, wherein the welding is soldering.

9. The silicon based condenser microphone according to claim 1, wherein the welding is bonding using a conductive adhesive.

10. The silicon based condenser microphone according to claim 1, wherein the board is formed with two to eight connecting terminals for connecting with an external device.

11. The silicon based condenser microphone according to claim 1, wherein the board is formed with a rear sound inlet hole for collecting a rear sound, whereby the microphone has directivity.

12. A method for packaging a silicon based condenser microphone, the method comprising the steps of:
   inputting a board which is mounted with a Micro Electro Mechanical System (MEMS) microphone chip and an application specific integrated circuit (ASIC) and is formed with a connecting pattern and at least one connecting terminal;
   inputting a metal case;
   aligning the metal case on the connecting pattern of the board; and
   welding an opened end of the metal case to the connecting pattern of the board, wherein the metal case and the connecting terminal are connected by way of the connecting pattern and the connecting terminal extends to a circumference of the board.

13. A silicon based condenser microphone comprising:
   a metal case having a bottom surface which is closed; and
   a board which is formed with a sound hole for collecting an external sound and a sealing terminal for sealing the sound hole by soldering to prevent distortion of a sound wave in the space between a main printed circuit board (PCB) and the microphone,
   the board being mounted with a Micro Electro Mechanical System (MEMS) microphone chip and an application specific integrated circuit (ASIC) chip having an electric voltage pump and a buffer IC,
   the board being formed with a connecting pattern for connecting with the metal case so that the metal case is bonded on the connecting pattern by welding;
   at least one connecting terminal connected with the connecting pattern, the connecting terminal extending to a circumference of the board.

14. The silicon based condenser microphone according to claim 13, wherein the metal case has any one of a cylindrical shape and a rectangular parallelepiped shape.

15. The silicon based condenser microphone according to claim 13, wherein an opened end of the metal case has any one of a straight line shape and a skirt shape which is formed by bending the opened end.

16. The silicon based condenser microphone according to claim 13, wherein the board is any one selected from the group of a PCB, a ceramic board, a flexible PCB (FPCB) and a metal PCB.

17. The silicon based condenser microphone according to claim 13, wherein the metal case is made of any one selected from the group of brass, aluminum and nickel alloy.

18. The silicon based condenser microphone according to claim 13, wherein the board is formed with two to eight connecting terminals for connecting with an external device.

19. The silicon based condenser microphone according to claim 13, wherein the sound hole of the board is formed on a portion where the MEMS chip is mounted and is not formed in the central portion of the board.

20. The silicon based condenser microphone according to claim 19, wherein the case is formed with a sound hole for collecting an external sound and is mounted with a sound resister on the inside and outside of the sound hole, whereby the microphone has directivity.

21. A silicon based condenser microphone which is mounted on a main printed circuit board (PCB) having an inserting hole into which the condenser microphone is inserted and connecting pads, the condenser microphone comprising:
   a metal case which is inserted into the inserting hole of the main PCB and has a closed bottom side;
   a board which is broader than the metal case, the board being formed with a sound hole on a central portion thereof and mounted with a Micro Electro Mechanical System (MEMS) microphone chip and an application specific integrated circuit (ASIC) chip having an electric voltage pump and a buffer IC, the board being formed with a connecting pattern for bonding with the metal case so that the metal case is bonded to the connecting pattern; and connecting terminals which are formed on a part side of the board which is mounted with the metal case to connect with the connecting pads of the main PCB, the connecting terminal extending to a circumference of the board.

22. The silicon based condenser microphone according to claim 21, wherein the metal case has any one of a cylindrical shape and a rectangular parallelepiped shape.

23. The silicon based condenser microphone according to claim 21, wherein an end of the metal case has any one of a straight line shape and a skirt shape which is formed by bending the end outwardly.

24. The silicon based condenser microphone according to claim 21, wherein the board is any one selected from the group of a PCB, a ceramic board, a flexible PCB (FPCB) and a metal PCB.

25. The silicon based condenser microphone according to claim 21, wherein the metal case is made of any one selected from the group of brass, aluminum and nickel alloy.

26. The silicon based condenser microphone according to claim 21, wherein the connecting terminals are formed with two to eight connecting terminals.

27. The silicon based condenser microphone according to claim 21, wherein the sound hole of the board is not formed in the central portion of the board, but formed on the position where the MEMS chip is mounted.

28. The silicon based condenser microphone according to claim 27, wherein the case is formed with a sound hole for collecting sound from the outside and is mounted with an additional sound resister on the inside and outside of the sound hole, whereby the condenser microphone has directivity.

* * * * *